(12) United States Patent
Bachellerie et al.

(10) Patent No.: US 7,084,555 B2
(45) Date of Patent: Aug. 1, 2006

(54) PIEZOELECTRIC DIAPHRAGM STRUCTURE WITH OUTER EDGE ELECTRODE

(75) Inventors: John R. Bachellerie, Oroville, CA (US); Steven A. Buhler, Sunnyvale, CA (US); John S. Fitch, Los Altos, CA (US); Meng H. Lean, Santa Clara, CA (US); Karl A. Littau, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 232 days.

(21) Appl. No.: 10/739,478

(22) Filed: Dec. 18, 2003

(65) Prior Publication Data

US 2005/0134153 A1 Jun. 23, 2005

(51) Int. Cl.
*H01L 41/08* (2006.01)
(52) U.S. Cl. ............... 310/357; 310/324; 310/366; 310/369
(58) Field of Classification Search ............... 310/324, 310/357, 359, 365, 366, 369
See application file for complete search history.

(56) References Cited

U.S. PATENT DOCUMENTS

| | | | |
|---|---|---|---|
| 2,953,755 A * | 9/1960 | Mattiat | 333/187 |
| 3,307,052 A * | 2/1967 | Neilson et al. | 310/338 |
| 3,571,632 A * | 3/1971 | De Jong | 310/326 |
| 4,045,695 A | 8/1977 | Itagaki et al. | |
| 4,170,742 A * | 10/1979 | Itagaki et al. | 310/324 |
| 5,643,353 A | 7/1997 | Wallace et al. | |
| 5,663,505 A | 9/1997 | Nakamura | |
| 6,234,608 B1 | 5/2001 | Genovese et al. | |
| 6,346,764 B1 | 2/2002 | Boyd | |
| 6,597,084 B1 * | 7/2003 | Hu et al. | 310/357 |

OTHER PUBLICATIONS

Kim, Sunghwan, et al., *Piezoelectric Energy Harvesting Using a Diaphragm Structure*, SPIE's 10 Annual Symposium on Smart Structures and Materials, Mar. 2-6, 2003, San Diego, CA. (11 pages).

Kim, Sunghwan, et al., *Piezoelectric Energy Harvesting Using a Clamped Circular Plate: Experimental Verification*, ASME International Mechanical Engineering Congress and Exposition, Washington, D.C., Nov. 2003 (pp. 1-17).

(Continued)

*Primary Examiner*—Thomas M. Dougherty
(74) *Attorney, Agent, or Firm*—Fay, Sharpe, Fagan, Minnich & McKee, LLP

(57) ABSTRACT

A multi-electrode piezoelectric diaphragm structure includes a diaphragm, piezoelectric material located on the diaphragm, which is defined as having a first area, and a second area. The first area of the piezoelectric is poled in a first direction, and the second area of the piezoelectric is poled in a second direction. The poled first direction is in a Z-axis of the piezoelectric and the poled second direction is in a Radial axis of the piezoelectric. A first electrode is positioned in the first area, on the first surface, of the piezoelectric. A second electrode is positioned in the second area, on the first surface, of the piezoelectric. A third electrode is located on a second surface of the piezoelectric. The application of voltages to the first, second and third electrodes generates electric fields in the piezoelectric material resulting in actuation of the piezoelectric material, or the application of pressure or strain to the diaphragm generates electric potentials at the first, second and third electrodes.

23 Claims, 13 Drawing Sheets

OTHER PUBLICATIONS

*Fundamentals of Piezoelectricity and Piezo Actuators,* http://www.pi.ws, pp. 4-15 thru 4-17.
Sayer, M., et al., *91-310: Poling of Piezoelectric Ceramics,* Journal of the Canadian Ceramic Society, vol. 50, 1981 (9 pages).

*Introduction to Piezo Transducers,* Piezo Systems, Inc., http://www.piezo.com/bendedu.html, Jul. 11, 2003, pp. 1-7.
Torah, R.N., et al., *Experimental Analysis of the Substrate Clamping Effects on the Piezoelectric Behaviour of Thick-Film PZT Elements* (7 pages).

* cited by examiner

US 7,084,555 B2

PIEZOELECTRIC DIAPHRAGM STRUCTURE WITH OUTER EDGE ELECTRODE

BACKGROUND

The present application is directed to piezoelectric diaphragm structures, and more particularly to piezoelectric diaphragm structures having optimized diaphragm displacement characteristics.

Piezoelectric diaphragm structures are implemented as actuators which move upon being supplied with electrical energy, and as sensors (e.g., pressure, movement, strain sensors) where diaphragm movement is translated into electrical signals. One particular implementation of a diaphragm structure is as part of an ejection unit used to eject drops such as ink, biofluid or other material from a fluid reservoir. In a desire to improve the efficiency of such ejection units, there is a continuing effort to reduce the voltages required for ejection, create ejector heads with higher nozzle density, and to reduce costs. Reaching these goals requires an improvement in the ejector efficiency, including an efficient diaphragm structure. In particular, an improved diaphragm structure will operate at a lower voltage, increase the volume displacement per volt, while also maintaining a low overall area and retaining adequate diaphragm stiffness.

A previous diaphragm structure is set out in U.S. Pat. No. 4,045,695 to Itagaki et al. which describes an electroacoustic transducer comprising a flexible film of piezoelectric material, at least one electrode being provided on one side of the film, and a plurality of electrodes being provided on the other side of the film to form a piezoelectric diaphragm. The diaphragm is imparted with a locally distinct resiliency and tension, and is implemented in a loudspeaker, making it possible to improve acoustic characteristics, particularly in a high-frequency range.

A second patent, U.S. Pat. No. 4,170,742, also to Itagaki et al., focuses on the specifics of the diaphragm structure layout, including a paddle-shaped first electrode in the center and a "C" second electrode exterior the first.

U.S. Pat. No. 5,663,505 to Nakamura discloses a pressure sensor, which includes a vibrator having a diaphragm valve for detecting pressure. A plurality of circular electrodes are located on planes of first and second piezoelectric bodies wherein the various electrode portions interact causing a radial vibration which acts to expand and contract the device in opposite directions. Operation of the upper and lower electrodes are intended to cause radial motion, without motion out of plane.

These references do not particularly discuss a design directed to optimizing the deflection of the diaphragm which increases the deflection per voltage applied. They also do not, among other concepts, define a structure, used in conjunction with the poling and actuation operations, which achieve an optimized diaphragm operation.

SUMMARY

A multi-electrode piezoelectric diaphragm structure includes a diaphragm, piezoelectric material located on the diaphragm, which is defined as having a first area, and a second area. The first area of the piezoelectric is poled in a first direction, and the second area of the piezoelectric is poled in a second direction. The poled first direction is in a Z-axis of the piezoelectric and the poled second direction is in a Radial axis of the piezoelectric. A first electrode is positioned in the first area, on the first surface, of the piezoelectric. A second electrode is positioned in the second area, on the first surface, of the piezoelectric. A third electrode is located on a second surface of the piezoelectric. The application of voltages to the first, second and third electrodes generates electric fields in the piezoelectric material resulting in actuation of the piezoelectric material, or the application of pressure or strain to the diaphragm generates electric potentials at the first, second and third electrodes.

DETAILED DESCRIPTION

The following description primarily emphasizes the use of a diaphragm structure as an actuator, wherein electric signals are provided to the diaphragm structure, causing movement. It is to be appreciated, however, the descriptions set forth herein are equally applicable to the use of a diaphragm structure as a sensor. In the design the diaphragm structure is used to generate output signals whereby the pressure or other physical environmental actions imposed on the diaphragm structure are sensed and delivered to an external source.

Figure 1:
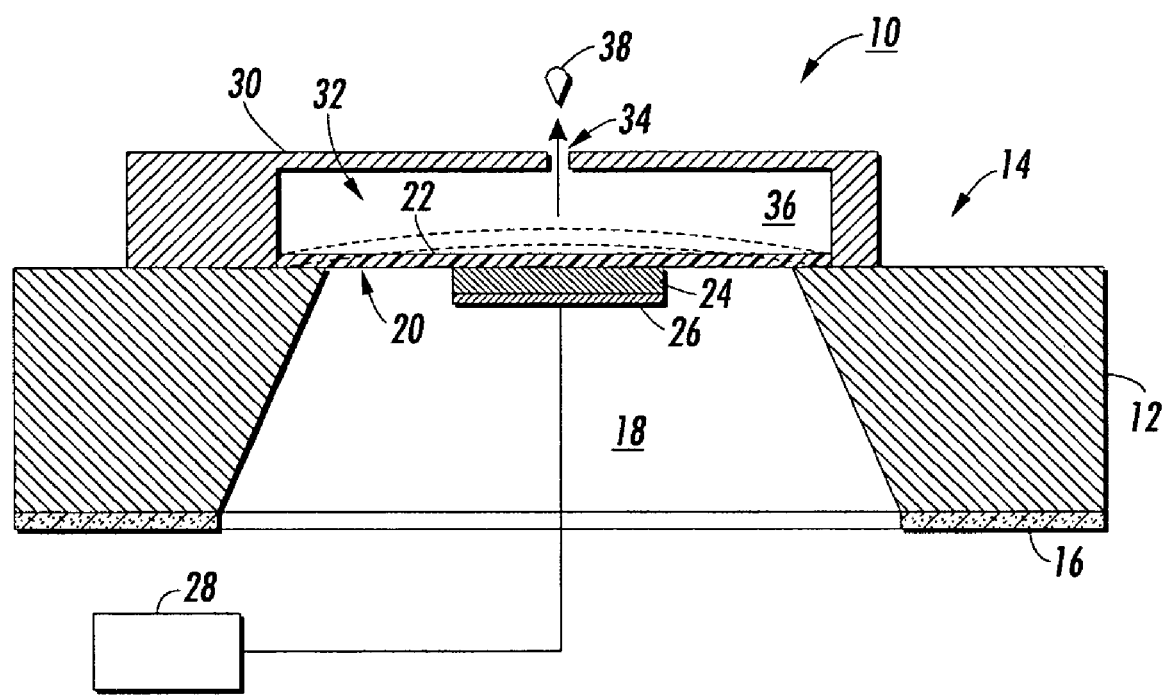
FIG. 1 is a conceptual drawing showing a piezoelectric ejection unit which may implement a diaphragm structure of the present application.

FIG. 1 illustrates a conceptual drawing showing a piezoelectric ejection device 10, which includes a plate 12 having two parallel surfaces 14, 16. The plate may be made from a metal, and anisotropically etched or otherwise manufactured to provide a recess 18 therein. Alternatively, plate 12 may be a silicon, glass or ceramic laminate where recess 18 is provided by an appropriate process, including, for example, by etching, molding or laser ablation. The recess 18 has a bottom surface 20 which is substantially parallel to plate surface 14, in order to form a relatively thin membrane for use as a diaphragm 22. Alternatively, diaphragm 22 may be a separate plate which is laminated or attached to the plate 12 after the recess 18 is formed. The recess bottom surface and thus the surface area of the diaphragm is predetermined to permit the appropriate deformation. Bottom surface 20 has a piezoelectric material 24 built, deposited or otherwise attached. An electrode 26 is positioned on a surface of the piezoelectric material 24, and is connected to a source of energy 28 such as a power supply. A nozzle plate 30 is formed on plate surface 14 and has an internal cavity 32, open against the plate surface and aligned with the diaphragm 22, to act as a fluid reservoir. The nozzle plate 30 has a nozzle 34 which may be centrally aligned with the diaphragm 22, or may be offset as appropriate. Cavity 32 is filled with fluid 36 through an inlet (not shown).

Actuation of energy source 28, causes energy, such as in the form of voltage, to be applied to piezoelectric material 24 via electrode 26, which in turn deforms the diaphragm 22 in the upward direction towards nozzle 34, as shown in dashed line. This action increases the pressure on fluid 36 in cavity 32, initiating the ejection process. A droplet 38 is ejected from nozzle 34 as diaphragm 22 moves upward. The diaphragm then moves in a direction away from the nozzle, as when voltage is removed from electrode 26.

Figure 2A:
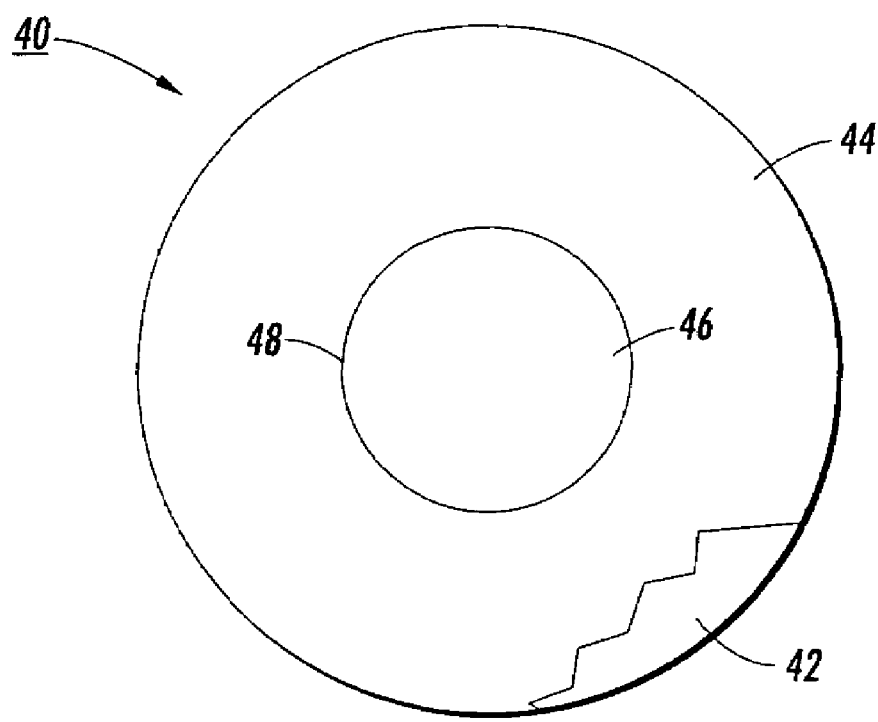
FIGS. 2A and 2B illustrate a two-region diaphragm structure in accordance with the present application.
Figure 2B:
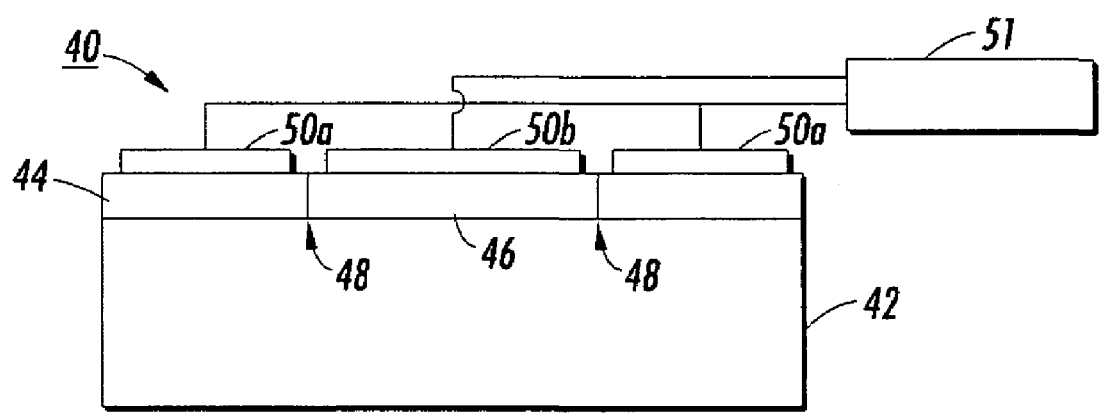

Turning to FIGS. 2A and 2B, set forth is a piezoelectric region diaphragm structure 40 in accordance with concepts of the present application. Diaphragm structure 40, includes a diaphragm 42, and a two-region piezoelectric component, composed of a piezoelectric annular ring 44 and a piezoelectric disc 46, separated by boundary 48. These regions are concentric and are attached to diaphragm 42, which may be made of any material having appropriate stiffness for an intended use, such as but not limited to stainless steel. It is to be understood that the diaphragm structures in this and other embodiments, are described with particular reference to a substantially circular design. However, such a description is only intended for ease of explanation and is not intended to limit the embodiments to circular designs. Rather, the disclosed concepts are equally applicable to other geometric shapes, such as but not limited to rectangular, diamond, rhombus or other shapes. In these instances, the structures would therefore have a central region (i.e., instead of a disc) or an outer edge region (i.e., instead of an annulas).

An upper surface of annular ring 44 carries a first electrode 50a, and upper surface of disc 46 carries a second electrode 50b, which form an electrode arrangement. Block 51 may represent a power source or a signal receiving device, dependant upon whether the two-region diaphragm structure 40 is operational as an actuator or sensor.

Figure 3A:
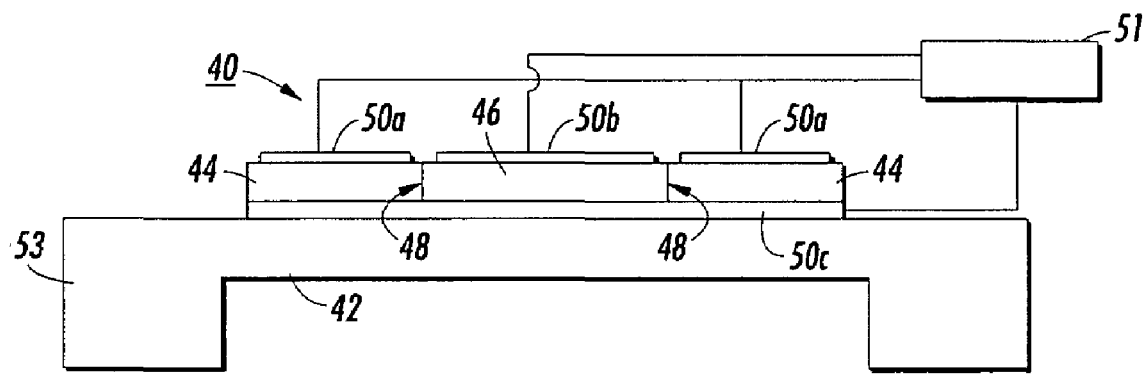
FIGS. 3A and 3B are partial cross-sectional and top views of a two-region diaphragm structure.
Figure 3B:
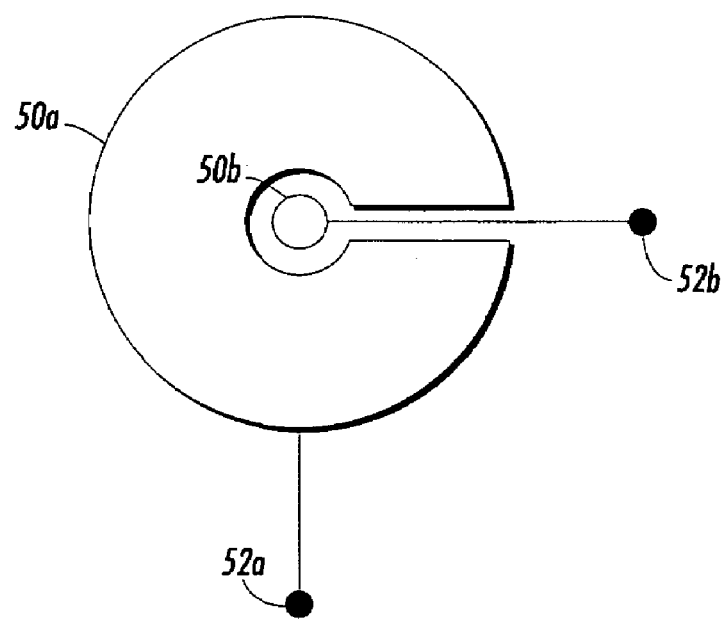

FIGS. 3A and 3B are partial cross-sectional and top views of two-region diaphragm structure 40. In addition to electrode 50a on a top surface of annular ring 44, and electrode 50b on a top surface of disc 46, an electrode 50c may be located on a bottom surface across both the annular ring 44 and disc 46. FIG. 3B shows the annular ring electrode 50a connected to conductor 52a, and disc electrode 50b connected to conductor 52b. These conductors are provided to a power source configuration (such as 51 of FIG. 2B) which drives the independent electrodes. Additionally, in FIG. 3A diaphragm 42 is shown being held by clamp or anchor section 53, similar to plate 12 of FIG. 1. A connection for electrode 50c is not shown in FIG. 3B. In practice it would be connected in a manner similar to electrodes 50a and 50b. Diaphragm 42 and clamp or anchor section 53 may be formed as a single integrated body, or these sections may be individual components fastened together by known techniques.

In this embodiment, the entire diaphragm is covered with piezoelectric material or the piezoelectric material may even overlap the diaphragm and extend onto the anchor section 53. Therefore, the stiffness of the diaphragm is maintained to a greater degree than diaphragm structures presently available, which tend to locate the edge of the piezoelectric material close to the edge of the active diaphragm, or somewhat interior. Those existing designs cause the stiffness of the diaphragm to be reduced at the edge of the active region, which affects the overall diaphragm stiffness. The increased stiffness afforded by the diaphragm structures in these figures improve performance in fluid-ejecting applications, as the resonance frequencies will be maintained at a high level.

Figure 4A:
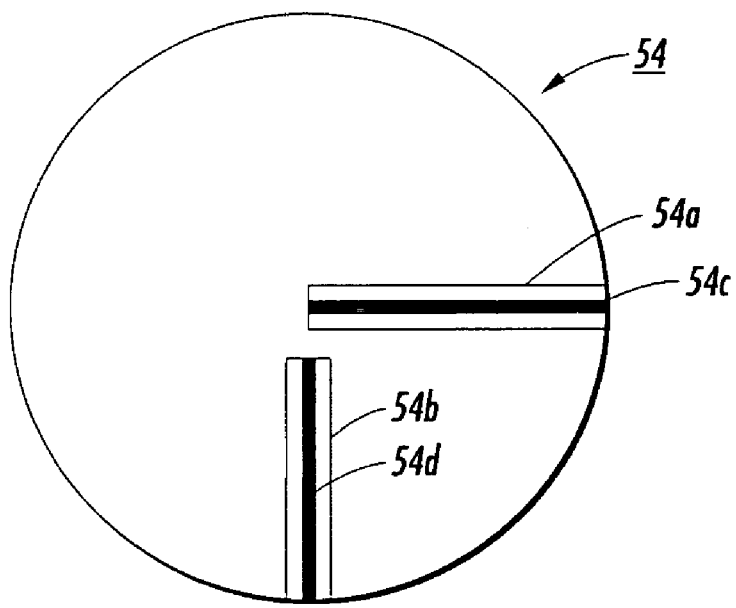
FIGS. 4A and 4B illustrate an oxide mesa design which may be used to connect to electrodes of each of the diaphragm structure embodiments.
Figure 4B:
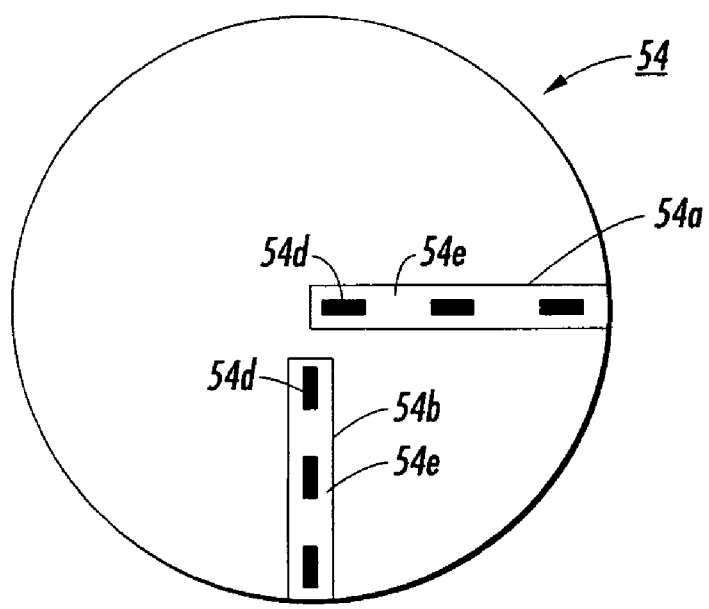

The foregoing embodiments may have conductors 52a and 52b (and a conductor for electrode 50c) provided in the Z-axis perpendicular to the electrodes. It is to be appreciated, however, other connection schemes may be used. One such alternative is, for example, shown by FIGS. 4A and 4B. This design employs an oxide mesa 54 to which the electrodes of piezoelectric material are attached. Grooves 54a, 54b are formed in mesa 54 from approximately an area corresponding to the center of the mesa to the edge of the mesa. Metal lines 54c and 54d are patterned or deposited within grooves 54a, 54b, providing external connections. The metal lines 54c, 54d in the grooves are selectively covered by an overcoat oxide 54e, such that metal which corresponds to electrodes, remain exposed. Then when placed into contact with the diaphragm structure (e.g., 40), appropriate connections to the electrodes are made. A similar connection to electrode 50c may also be configured.

Figure 5A:
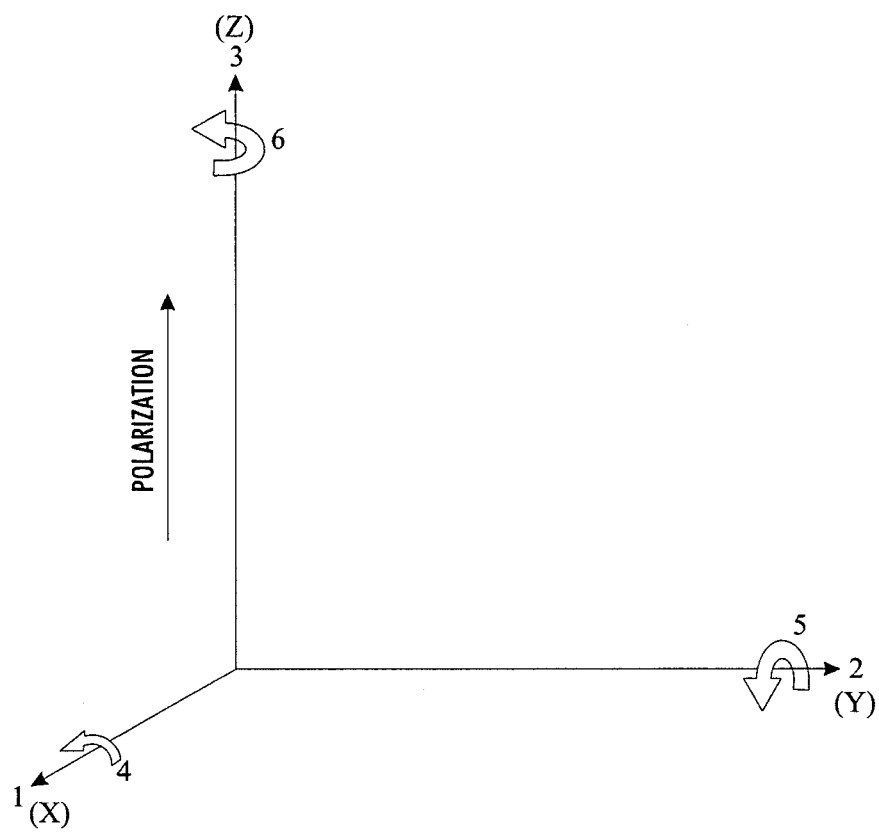
FIG. 5A identifies directions of the axes of poling directions in a conventional coordinate system.
Figure 5B:
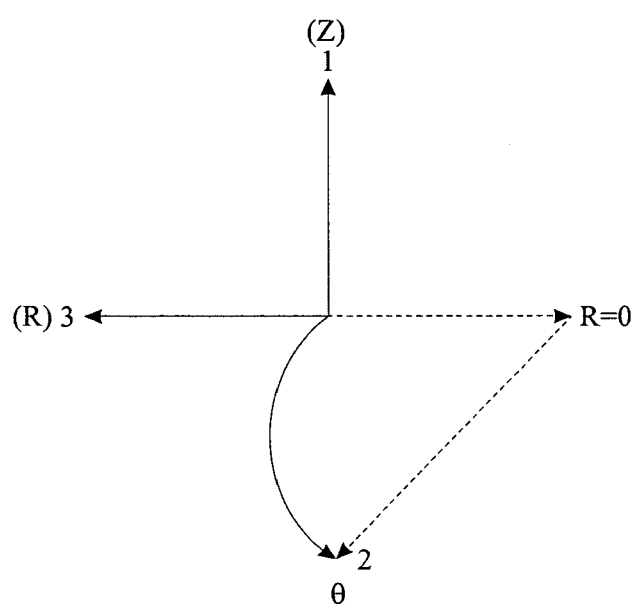
FIG. 5B identifies directions of the axes of poling directions in a cylindrical coordinate system.

Turning to the manufacture of the piezoelectric diaphragm structures, a stage of manufacture includes poling of the piezoelectric material. Due to the anisotropic nature of piezoelectric material, effects are dependant upon direction. Therefore, as depicted in FIG. 5A, to identify directions in one design, the axes or directions, termed 1, 2 and 3, are introduced, analogous to X, Y and Z of the classical right-hand orthogonal coordinate system. The axes 4, 5 and 6 identify rotations (i.e., shear). In another design, and as will be explained in more detail below, the convention of direction described in FIG. 5A is altered or rotated to a position such as shown in FIG. 5B. In this coordinate system, the reference directions are provided in what may be considered a cylindrical coordinate system, where direction 1 is in the Z-axis, direction 3 is now in a radial in-plane direction, and direction 2 is designated as a θ position, representing the cylindrical aspect of the coordinate system. FIG. 5B is intended to emphasize an alternative polarization mode which will be expanded on below.

The poling process uses relatively high voltages to obtain the required applied field, creating the possibility of dielectric breakdown under the high applied field. Therefore, an objective of the poling process is to provide a maximum amount of reorientation of the piezoelectric domains using the lowest applied field in the shortest possible time. A number of poling techniques, including DC poling, DC plus AC poling, as well as pulse or switched DC poling, have been described, and any of these or other appropriate poling techniques may be used. These poling techniques may be implemented with elevated temperatures, to facilitate the poling operations.

Once the piezoelectric material has been poled, application of an electric field (E-field) will displace the piezoelectric. This displacement of the poled piezoelectric is primarily a function of the applied electric field strength (E), the piezoelectric used, and the length (L) of the piezoelectric. The material properties can be described by the piezoelectric strain coefficients $d_{ij}$, which describe the relationship between the applied electrical field and the mechanical strain produced.

The most common mode of operation is a $d_{31}$ mode which applies when polarization of the piezoelectric is in direction 3 of the classic orthogonal coordinate system—where the electric field points in the direction 3 (i.e., FIG. 5A)—and the strain is in the 1 axis (i.e., orthogonal to the polarization axis). An alternative mode of operation, which has been considered by the inventors is a $d_{33}$ mode, which occurs when polarization is in direction 3 of the cylindrical coordinate system—where the electric field points in the direction 3 (i e., FIG. 5B)—and the strain (deflection) is along the same axis. Thus, operation in the $D_{31}$ mode (with reference to FIG. 5A) will include having polarization in the Z-axis (direction 3) extending out of the piezoelectric material, where the E-field will be applied in the Z-axis (direction 3) in-plane. On the other hand, operation in the $d_{33}$ mode reflects the coordinate system shown in FIG. 5B, where, the poling direction is in the R (radial) axis (direction 3) with the applied E-field also being in direction 3.

In the $d_{31}$ mode, applying the E-field in direction 3 at a first polarity causes the piezoelectric to expand, and reversing the polarity causes contraction.

In the $d_{33}$ mode, when the generated E-fields are parallel to the poling direction, the design is in a parallel state, and the piezoelectric will expand. When an expanding piezoelectric is built on or otherwise attached to a diaphragm, the expansion of the piezoelectric causes bending motion of the diaphragm, thereby resulting in the overall structure moving to a convex position, when observed from the piezoelectric side. Contraction of the piezoelectric will occur when the E-field is anti-parallel the poling direction, which pulls in the piezoelectric, causing a counter bending reaction in the diaphragm, resulting in movement to a concave position. Thus, in the two-region diaphragm structure 40, actuation of the first area causes a length change in the Radial direction and actuation of the second area causes a length change in the Radial direction, of an opposite sign of the first area.

The $d_{33}$ mode of operation makes it possible for annular ring 44 to take advantage of the transverse changes in geometry obtained in the $d_{33}$ mode, which are two to three times larger than the transverse changes available in the $d_{31}$ mode, for most piezoelectric materials.

With continuing attention to two-region diaphragm structure 40 of FIGS. 2A, 2B and 3A, 3B, in one embodiment both the annular ring 44 and disc 46 are configured for operation in the $d_{31}$ mode. In this design, one of the regions, for example the disc electrode 50b, as illustrated in FIG. 3B, will have a positive voltage applied, and the annular ring electrode 50a will have a negative voltage applied relative to common bottom electrode 50c. Given uniform poling in a Z-axis, one region will expand, causing bending in a concave down fashion, and the other region will contract causing bending concave upwards. Both of these motions work together to provide a maximum total deflection. The selection where the occurrence of a concave-down versus a concave-up transition exists, is guided by the natural bending modes of the diaphragm and is shown by boundary 48.

Figure 6:
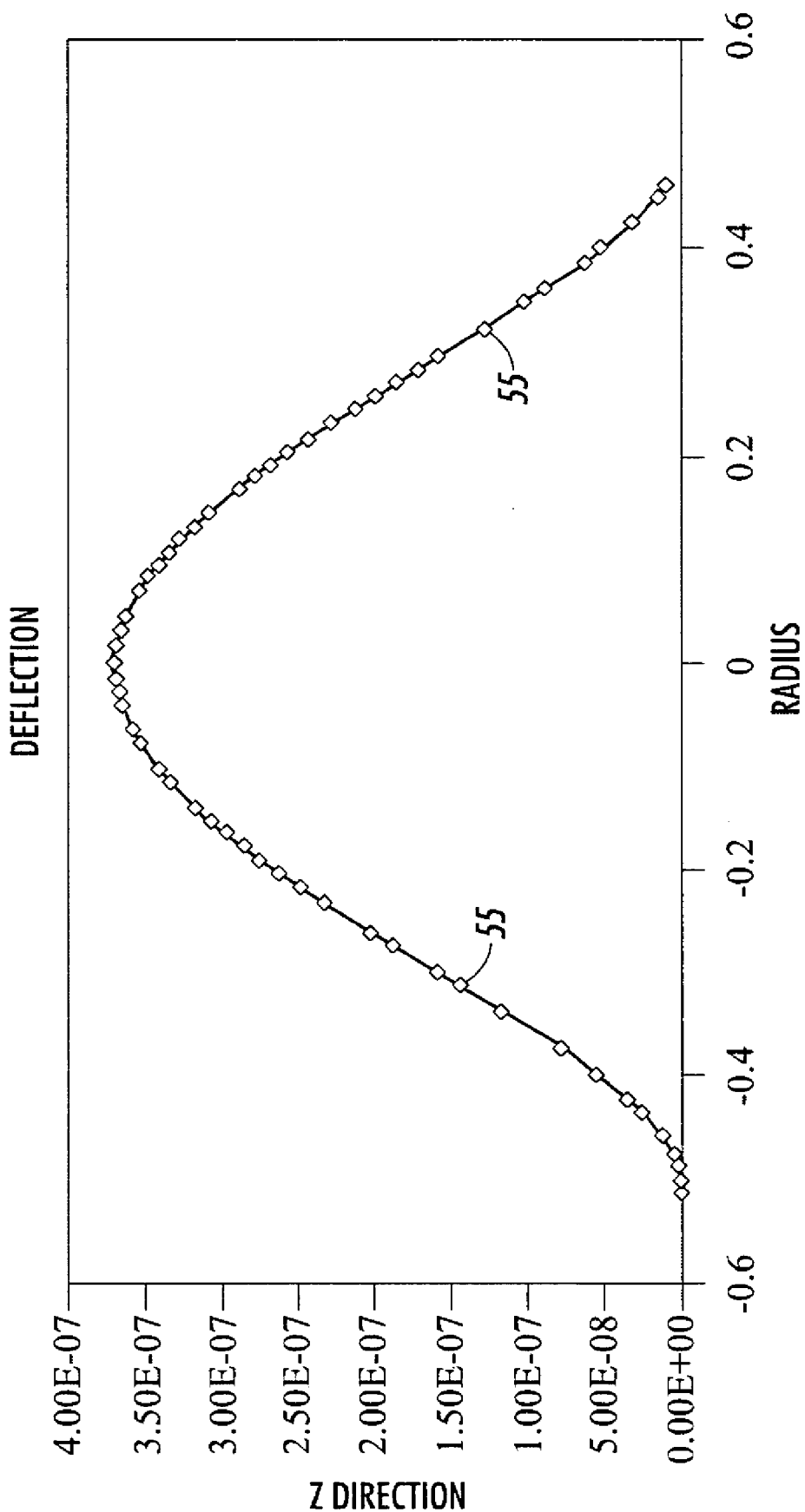
FIG. 6 is a chart illustrating the results of deflection for a two-region diaphragm structure.

Since the selection of boundary 48 between annular ring 44 and disc region 46 does not affect stiffness, a simulation of the deformation of the diaphragm under applied pressure will appear the same for all locations of the boundary. FIG. 6 provides the results of such modeling for an active diaphragm having a 500 micron radius. A reasonable fit to the data provides a simple polynomial which can be solved analytically to define various features of the system. The radius of inflection in one dimension (R) and the radius which corresponds to the sum of the second derivatives (2-D equating to zero (2-D "inflection", a "saddle point" R, and Theta)) 55 is noted in FIG. 6. Alternatively, one may solve the full analytical expression for deformation and find the same point.

Figure 7:
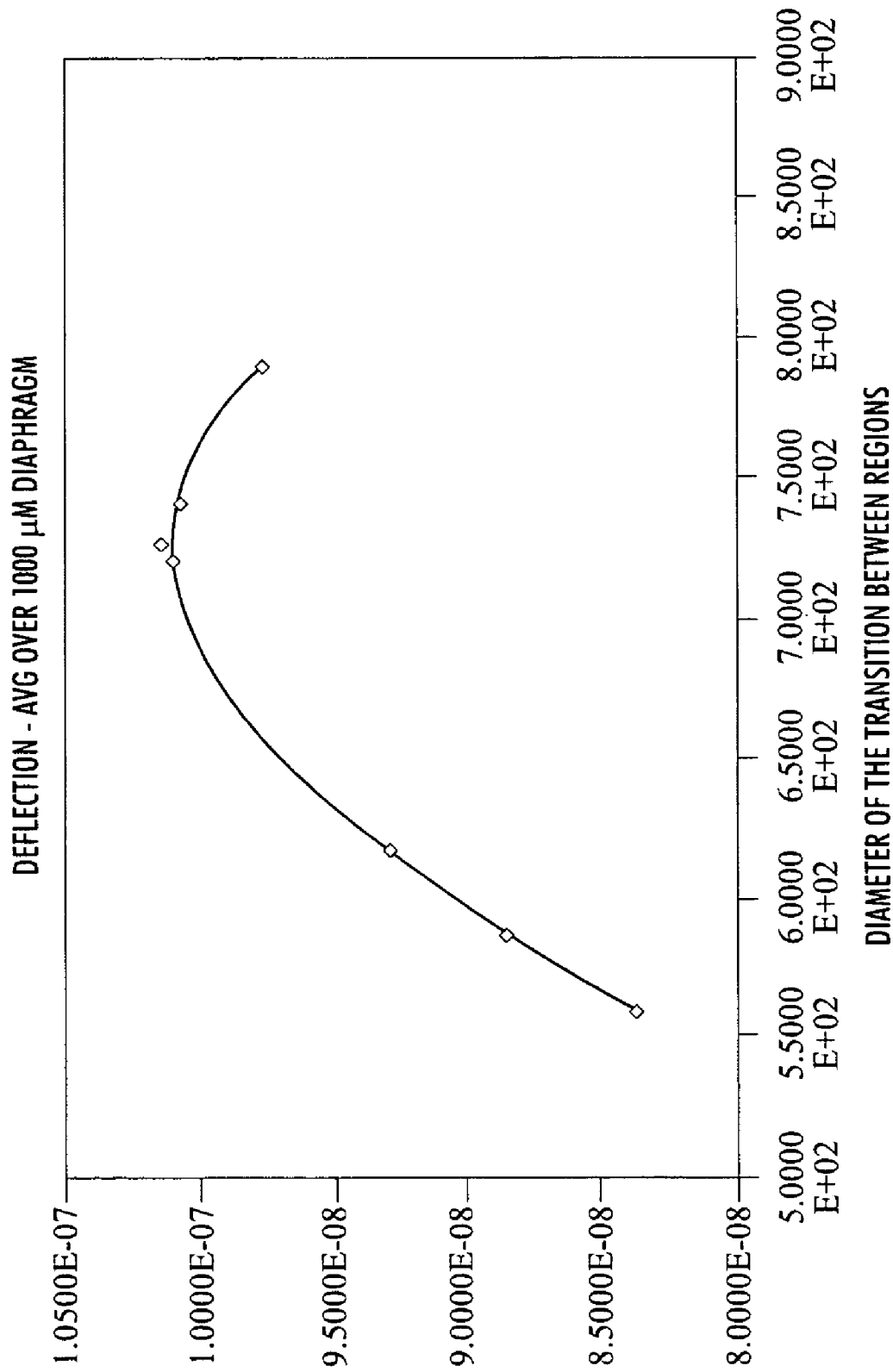
FIG. 7 is a chart depicting an optimum boundary point for a two-region diaphragm structure according to the present application.

Total 2-D inflection radius is the radius (e.g., approximately 0.36) where curvature in the X-axis plus the curvature in the Y-axis is equal to zero. On first inspection, it may be assumed that the optimum boundary location 48 would correspond to the inflection point on the R axis (1-D). However, the optimum boundary point turns out to be the 2-D inflection location, as illustrated in FIG. 7 (i.e., for a 1,000 micron diameter, each point is the result of a simulation run, and the optimum is approximately 73%, compared to the 72% from analysis in FIG. 6). For voltages applied oppositely to the disc 46 and the annular ring 44 (on their tops with respect to the bottom), the piezoelectric tends to curl down in the center and curl up around the edge. The ideal location for the boundary 48 utilizes this tendency to produce the optimal displacement of the diaphragm when voltage is applied.

From a simulation with a typical diaphragm structure, this two-electrode 50a, 50b design provides an approximate 57% improvement of volume displacement versus voltage over an optimal single electrode design (with diameters scaled to give matching $C_p$, where $C_p$ is volume displacement per unit pressure applied). The optimum $C_v$ (where Cv is the volume displaced per unit volt applied) for a single electrode design, with a thickness of material used in this example, is with approximately 80% coverage of the diaphragm with the piezoelectric material.

In the described structure, increased deflection of the diaphragm occurs as compared to a single electrode design, since the contraction and expansion of the piezoelectric material is matched to the natural bending mode of the diaphragm. Contraction is initiated in the central region when it is desired to have a concave-up position. An expansion of the piezoelectric in the central region is used when it is desired to have a concave-down position (given that the piezoelectric is on top of the diaphragm). The overall stiffness pressure per volume displaced ($1/C_p$) is maintained and even improved over conventional single electrode construction, and the voltage requirements for actuation are decreased. Stated alternatively, the volume displaced per unit volt applied ($C_v$) is increased over single region designs.

Figure 8:
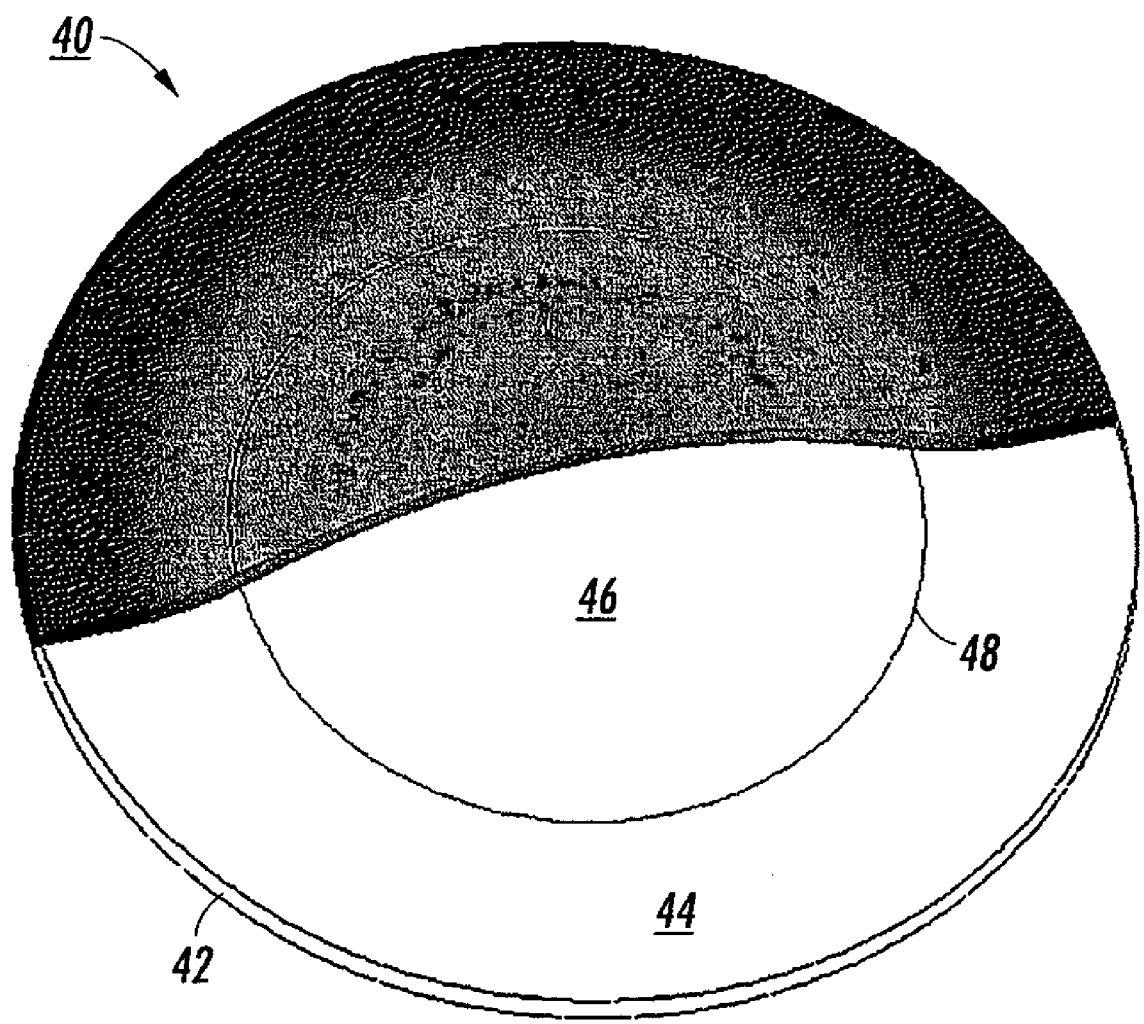
FIG. 8 illustrates a view of a partial diaphragm structure in accordance with an embodiment of the present concepts.

In the preceding electrode configuration, annular ring 44 and disc 46 of diaphragm structure 40 were driven in the same $d_{ij}$ mode. The following describes an embodiment where a mixed poling and electric field arrangement is used for annular ring 44 and disc 46. Particularly, as shown in FIG. 8, construction of the present embodiment is similar to that previously described in that there are two regions of piezoelectric defined as the annular ring 44 and disc 46, which are concentric to each other and attached to diaphragm 42. When pressure is applied to diaphragm structure 40, it will bend into a shape such as shown in FIG. 8, which illustrates a natural bending shape for the circular diaphragm, and which is the shape that is obtained with the lowest energy for a given deflection. Boundary 48 is located at the intersection of the annular ring 44 and disc 46, where the disc 46 is shown generally concave downward, and the annular ring 44 is concave upward.

Figure 9A:
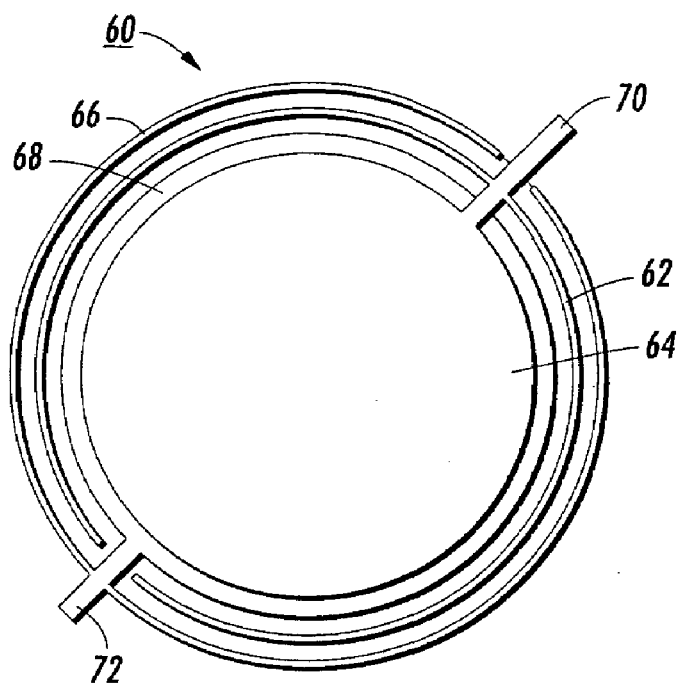
FIGS. 9A–9B show atop and a side view of a partial diaphragm structure in accordance with the present concepts.
Figure 9B:
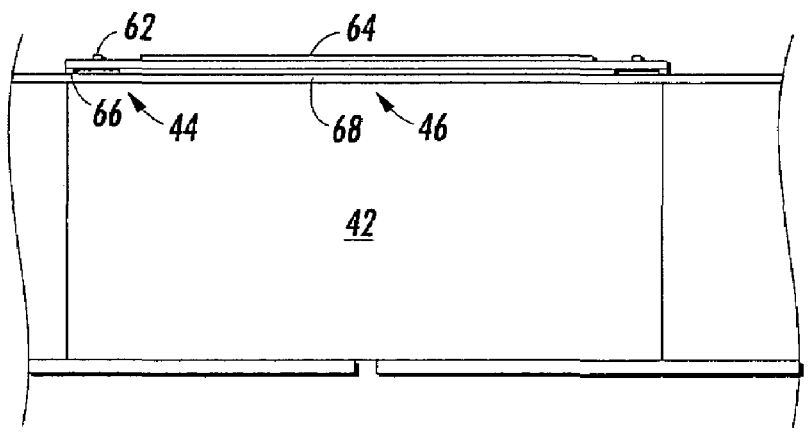

FIGS. 9A–9B emphasize the two-region design may also include configurations with multi-electrodes on both surfaces of the piezoelectric (i.e., an annular ring electrode and disc electrode arrangement on a second surface of the piezoelectric). More specifically, FIG. 9A depicts a diaphragm structure 60 with an annular ring electrode 62 and disc electrode 64 on a top surface of a piezoelectric (not shown), and an annular ring electrode 66 and disc electrode 68 on a bottom surface of the piezoelectric. The top surface electrodes 62 and 64 are provided with power via conductor 70, and the bottom side electrodes 66 and 68 being provided with power via conductor 72.

FIG. 9B (which is an enlarged view of FIG. 9A) more clearly illustrates the diaphragm structure 60 includes a staggered electrode design. More specifically, the top annular ring electrode 62 is offset or staggered from the bottom annular ring electrode 66. Similarly, top disc electrode 64 is also not aligned with bottom disc electrode 68. It is to be noted that an alternative embodiment includes the electrodes in a non-staggered/even arrangement.

With continuing attention to FIGS. 9A–9B, the outer bottom annular ring electrode is in this embodiment designed with a diameter of 1.000 mm (1000 microns), the diameter of the upper annular ring electrode 62 is 0.910 mm (910 microns), the diameter of the lower disc electrode 68 is 0.830 mm (830 microns) and the diameter of the upper disc electrode 64 is 0.760 mm (760 microns). The distance of stagger between the lower annular ring electrode 66 and the upper annular ring electrode 62 is 0.035 mm (35 microns). It is to be appreciated the foregoing values are representative, values which are not intended to limit the present embodiment, and it is to be understood other sizes and values may be used which permit implementation of the disclosed concepts.

As the entire diaphragm 42 is covered with piezoelectric material in the designs of FIGS. 8 and 9A–9B, the stiffness of the diaphragm is maintained over conventional designs, which tend to locate the edge of the piezoelectric close to the edge of the active diaphragm or somewhat interior, thereby allowing the stiffness to be reduced at the edge of the active region, and thereby causing the overall stiffness. This higher stiffness design is particularly beneficial in improving performance in fluid ejection applications as the resonance frequencies are maintained at a higher level in these designs.

In the present embodiment, actuation of the annular ring and the disc are accomplished by distinct modes of operation. The annular rings are poled and operated to function in the $d_{33}$ mode, whereas the disc regions are configured and operated in the $d_{31}$ mode.

To achieve these alternate modes of operation, the annular rings are poled in the R (radial) axis, and the discs are poled in the Z-axis. In some applications, the vector of poling for the outer region (annular rings) may implement a complex function of position, since the poling would generally be accomplished by application of the high voltage to the electrodes of 3 to 15 times the operating voltage (1 to 5 times the coercive field strength). The field in the R axis would be established by adjustment of the voltages for optimum effect during the poling. The specific position and adjustment of voltages would vary from design and size of the piezoelectric. Such positioning would, however, upon the teaching of the present application be within the understanding of one of ordinary skill in the art. Therefore, for purposes of descriptions herein, the poling is considered to be radial in direction.

Employing this dual electrode design with differing driving conventions, permits multiple driving options. FIGS. 10A–10D are presented to illustrate various ones of these driving options. In particular, when disc electrode 68 is grounded (i.e., $V_{bot1}$ in the figures), then varying combinations, and values of voltages $V_{top1}$, $V_{top2}$, and $V_{bot2}$ may be applied to electrodes 62, 64 and 66 respectively.

In FIGS. 10A–10D disc portions 46 have been poled to operate in the $d_{31}$ mode, wherein the electric field (E) is applied in a direction opposite the poled field (P). The annular ring portions 44 are poled in the radial direction (P). However, electrodes 62 and 66 (presented in a staggered configuration) have electric fields applied to alter their expansion and/or contraction states. For example, in FIG. 10A, both top electrode 62 and bottom electrode 66 have E-fields applied to cause top region and bottom region expansion of the piezoelectric. This is illustrated by showing the arrows coming into the electrodes.

Figure 10A:
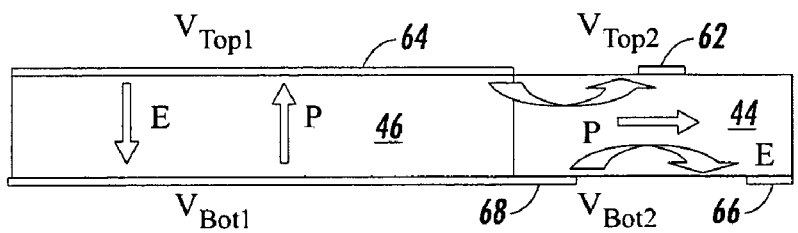
FIGS. 10A–10D are investigated options of the application of E-fields to the diaphragm structures in accordance with the present concepts.
Figure 10B:
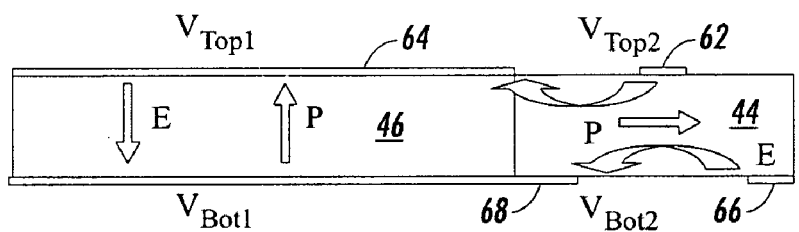
Figure 10C:
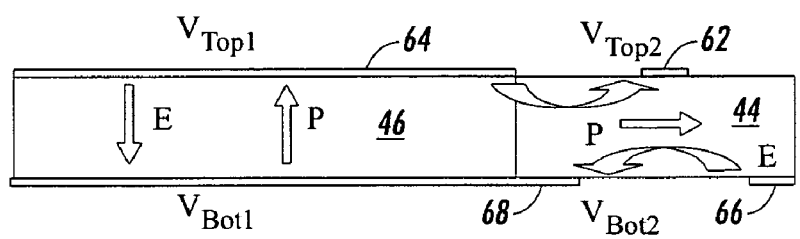
Figure 10D:
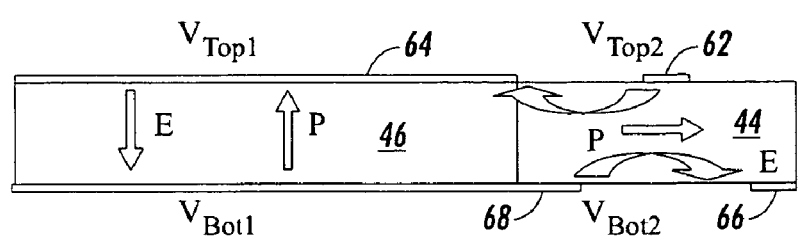

FIG. 10B shows the application of the E-fields which causes a contraction of both the top and bottom of the piezoelectric. This situation is depicted by showing the arrows extending from electrodes 62 and 66. FIG. 10C illustrates an embodiment where electrode 62 has an E-field applied to cause a top expansion of the piezoelectric, whereas the application of an E-field to electrode 66 causes a bottom piezoelectric contraction. Lastly, in FIG. 10D, the E-field is applied to electrode 62 to cause a top piezoelectric contraction, whereas the application of the E-field to bottom electrode 66 causes a bottom piezoelectric expansion.

Figure 11:
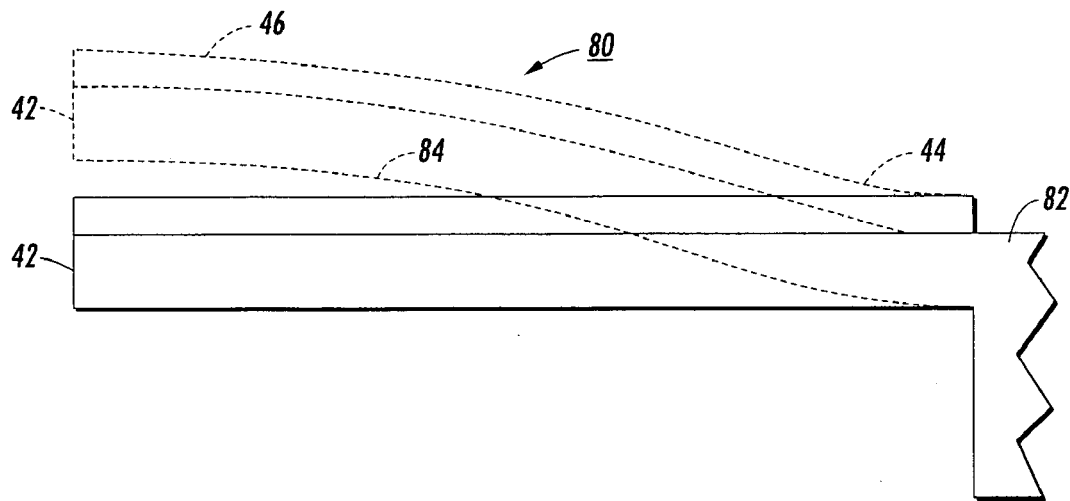
FIG. 11 is a partial side view of a diaphragm displacement for option 10C above.

Turning to FIG. 11, shown is a partial diaphragm structure 80 attached to an anchor portion 82. In a first state, the diaphragm structure is shown having no voltages applied and is, therefore, in substantially a planar position. However, upon application of the voltages such as in FIG. 10B, the combination of those voltages provide a deflection of the diaphragm 42 where the center 84 is bending into a spherical shape (i.e., concave downward, which occurs when the diaphragm 42 is deflected upward). At the same time, the annular ring 44 is bending into a cylindrical shape which smoothly joins to the disc 46. The joint radius for maximum deflection is at the same radius as shown in FIG. 8. The bending in the center 84 in this situation is caused when the piezoelectric expands in the plane of the diaphragm 42, which it does when the electric field is applied in the opposite direction as the poling vector. The outer edge (annular ring) 44 in this case tends to curl into a cylinder from which best joins to the center 84 when the piezoelectric in this region is contracting. The voltage applied to the annular rings result in an electric field which is mostly anti-parallel to the poling vector.

Figure 12:
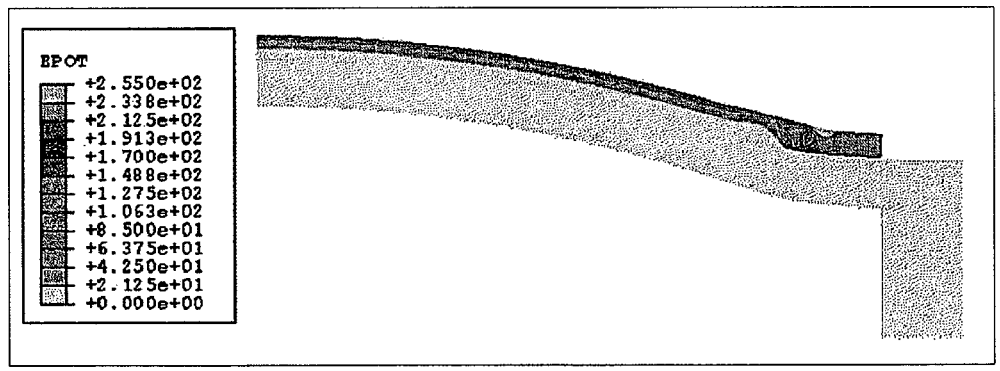
FIG. 12 is an alternative view of FIG. 11 showing the voltage penetration into the piezoelectric.

The partial view of FIG. 11 is also shown graphically in FIG. 12 which emphasizes where the voltage penetrates into the piezoelectric, and that the largest voltage penetration is at the annular ring.

Figure 13:
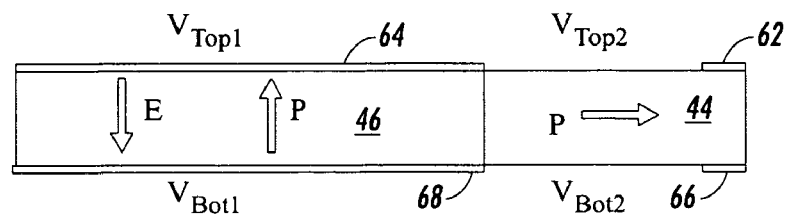
FIG. 13 illustrates the poling directions of the disc and annular ring, as well as the E-field direction of the disc in preparation for the various options of voltage applications to the annular ring such as in FIG. 14.

Turning to FIG. 13, set forth is an outer edge electrode diaphragm displacement design where the disc is operated in the $d_{31}$ mode and the annular ring in the $d_{33}$ mode. The annular rings electrodes 62, 66 are even, as opposed to a staggered design. As previously described and as again shown in FIG. 13, disc 46 of the piezoelectric is poled in the Z-axis, with the electric field (E) applied in an opposite direction. The annular ring 44 has the piezoelectric poled in a radial direction (R) in plane with the material. Thereafter, the various options of voltage application shown in FIGS. 10A–10D are applied to the electrodes.

In connection with the designs of FIGS. 10A–10D and 13, it was determined, by simulation, that the embodiment resulting in the highest usable deflection was provided by the top contraction, bottom contraction for the non-staggered design of FIG. 13. The generated values for this option are set forth in the third section of the following TABLE 1, which also lists results for a structure such as shown in FIGS. 10A–10D, employing the staggered electrode design. The top contraction and bottom contraction combination of the even electrode design results in the second greatest deflection (i.e., 566.31 $U_{max}$) for the even electrodes, causing a volume displacement ($\Delta V$) of 190.45 pL. This deflection was obtained by applying 60 volts to electrode 64, 285 volts to electrode 62, grounding (0 volts) electrode 68, and the application of 225 volts to electrode 66. It may be noted that the scenario of applying voltage so as to expand the top and contract the bottom of piezoelectric provides a greater volume displacement (212.81 pL). However, the intent of the present deflection scenarios are to apply a voltage such that the field strength in the material is maximized, but where the voltage does not approach the coercive field for the piezoelectric material at any point.

The simulations undertaken for the present embodiments were targeted to achieve peak fields of 3 volts per micron as a practical value. With regard to the top expand, bottom contract option for the even electrode design, however, this option was simulated with a voltage which exceeded the coercive field in the piezoelectric between the top and bottom outer electrodes and therefore would be undesirable. Also, while the obtained values for the staggered design in the first section of TABLE 1 are greater (i.e., 626.67; 624.56) than the non-staggered design, the staggered design may not be as desirable as the non-staggered design due to manufacturing issues and the ability to pole properly.

TABLE 1 further provides results of simulations for an outer edge electrode (OEE) (annular ring electrode) where the annular rings are equal to each other with a 450 micron radius and have a width of 40 μm.

As may also be determined by a review of TABLE 1, the simulation to generate this table defined the diaphragm radius ($r_{diap}$) as being 0.5 mm, the radius of the piezoelectric ($r_{PZT}$) at 0.5 mm, the thickness of the PZT ($t_{PZT}$) at 20 μm, the thickness of the diaphragm ($t_{diap}$) at 38 μm and the applied electric field (E) at about 3 V/μm.

Figure 14:
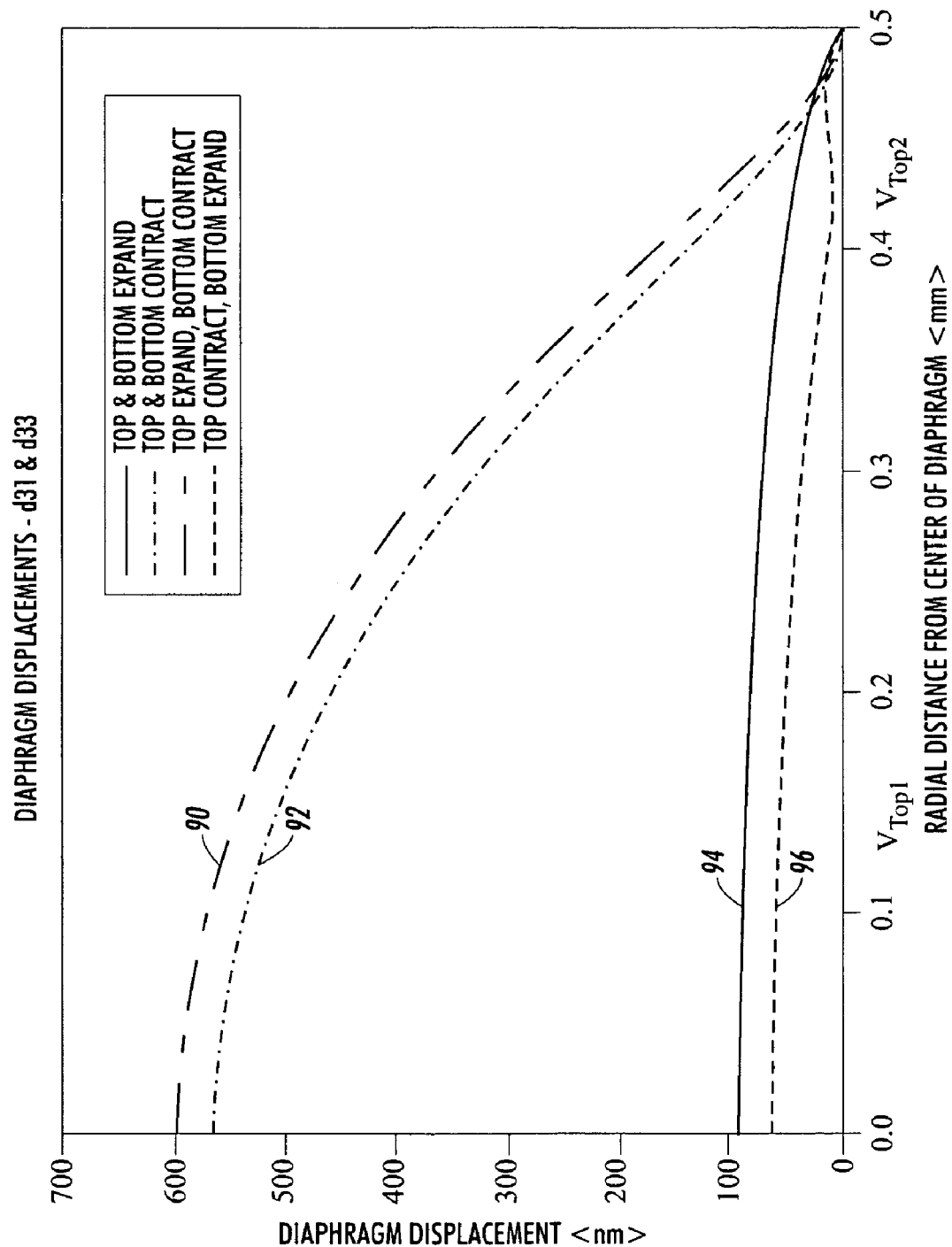
FIG. 14 presents a set of curves illustrating various applications of voltages to the outer electrodes of the annular ring.

In FIG. 14, curves 90–96 correspond to top and bottom expansion options which were previously discussed in connection with the staggered electrode design of FIG. 13 and whose values correspond to the third section of TABLE I. As noted here, curve 90 represents an option where the application of voltages to the annular electrodes causes top expansion AND bottom contraction of the piezoelectric. This results in the largest deflection curve, whereas the remaining curves 92–96 show lesser degrees of deflection for their specific application of voltages of the annular ring electrodes.

Thus, disclosed is a radial poling and application of electric fields to generate a $d_{33}$ mode of operation for annular rings, in combination with operation of a disc in a $d_{31}$ mode. The electrodes on the annular ring are positioned in relationship to each other as in an even or staggered arrangement. Typical values for bulk ceramic PZT using $d_{33}$ mode are approximately 500 pM per volt, and typical values for bulk ceramic PZT using $d_{31}$ mode are approximately −200 pM per volt. An aspect of the present concepts as directed to drop ejection, is an optimized usage for multi-sized droplet ejection, which may be achieved by selective application of voltages to the disc and the annular ring electrodes in alternative combinations to give variable sized droplets.

Figure 15:
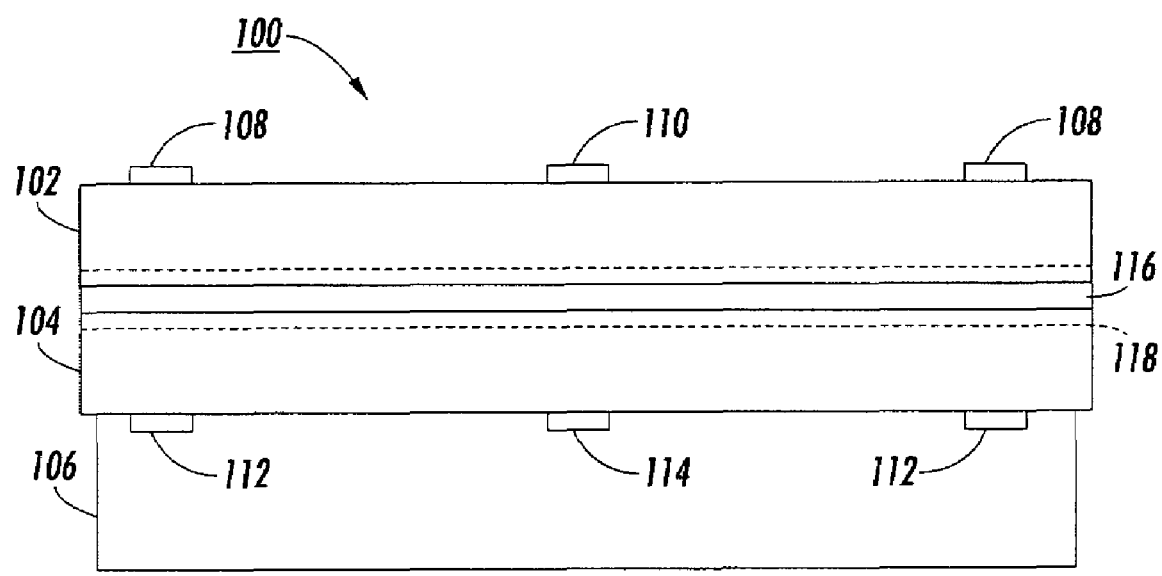
FIG. 15 depicts a bimorph structure which may be used in accordance with the present application.

The foregoing discussion has primarily focused on unimorph diaphragm structures. As defined herein, a unimorph diaphragm is one with a single piezoelectric. It is to be appreciated, the concepts of the present application may also be used in connection with a bimorph diaphragm structure 100, such as illustrated in FIG. 15. In this design, instead of a single piezoelectric, two piezoelectrics 102, 104 are used to actuate diaphragm 106. Piezoelectric 102 is provided with energy via electrodes 108 and 110. Whereas piezoelectric 104 is supplied with energy via positive electrodes 112 and 114. In this figure, electrodes 112 and 114 are shown on a bottom surface of piezoelectric 104. It is to be understood that this is simply one embodiment, and these electrodes may be on a top surface as in other designs. The bimorph piezoelectric elements 102, 104 may also be designed with

TABLE 1

Comparative PZT Displacements
$r_{diap}$ = 0.5 mm, $r_{PZT}$ = 0.5 mm, $t_{PZT}$ = 20 μm,
$t_{diap}$ = 38 μm, E ≈ 3 V/μm

| PZT | Cases | $U_{max}$ (nm) | $\Delta V$ (pL) | $V_{t1}$ (V) | $V_{t2}$ (V) | $V_{b1}$ (V) | $V_{b2}$ (V) |
|---|---|---|---|---|---|---|---|
| OEE Stagger Elect | Top expand Bottom expand | 125.40 | 53.50 | 60 | −135 | 0 | −225 |
| | Top contract Bottom contract | 626.67 | 195.42 | 60 | 255 | 0 | 225 |
| | Top expand Bottom contract | 624.56 | 218.62 | 60 | −135 | 0 | 225 |
| | Top contract Bottom expand | 127.51 | 30.30 | 60 | 255 | 0 | −225 |
| OEE Even Elect 450 w = 40 μm | Top expand Bottom expand | 158.20 | 66.67 | 60 | −60 | 0 | −60 |
| | Top contract Bottom contract | 400.23 | 147.81 | 60 | 180 | 0 | 60 |
| | Top expand Bottom contract | 421.63 | 157.16 | 60 | −60 | 0 | 60 |
| | Top contract Bottom expand | 136.80 | 57.32 | 60 | 180 | 0 | −60 |
| OEE Even Elect 415 w = 75 μm | Top expand Bottom expand | 93.54 | 45.84 | 60 | −165 | 0 | −225 |
| | Top contract Bottom contract | 566.31 | 190.45 | 60 | 285 | 0 | 225 |
| | Top expand Bottom contract | 596.15 | 212.81 | 60 | −165 | 0 | 225 |
| | Top contract Bottom expand | 63.69 | 23.48 | 60 | 285 | 0 | −225 | each piezoelectric elements 102 and 104 having electrodes on both upper and bottom surfaces. The piezoelectrics may be connected to each other by an adhesive interface 116. However, alternatively, and as shown by the dotted line, an inert conductive centerplate 118 may be provided to isolate the two piezoelectric structures from each other. In one embodiment, the centerplate may be a stainless steel plate. Piezoelectrics 102, 104 may be configured as discs, annular rings, or a combination thereof, as disclosed in the preceding discussion.

As mentioned at the beginning of this description, while the present discussions have focused on use of the diaphragm structure as an actuator, wherein electric signals are provided to the structure to cause movement of the piezoelectric material, the teachings set forth herein permit the diaphragm structure to also be used as a sensor. In this regard, and for example the power source, such as power source 51 of FIG. 2B, is initially described as delivering power to the electrodes (i.e., 50a, 50b). This arrangement also teaches a structure that permits the generation of electric signals in response to from movement of the piezoelectric material due to some physical action, such as the application of pressure of strain, on the diaphragm structure. In this arrangement, generated electric signals are transmitted from the electrodes 50a, 50b and delivered to a power receiving device, which may be represented by element 51 of FIG. 2B.

While the exemplary embodiment has been described with respect to specific embodiments by way of illustration, many modifications and changes will occur to those skilled in the art. It is, therefore, to be understood that the appended claims are intended to cover all such modifications and changes as fall within the scope and spirit of the exemplary embodiment.

What is claimed is:

1. A multi-electrode piezoelectric diaphragm structure comprising:
   a diaphragm;
   a piezoelectric material located on the diaphragm, defined as having a first area and a second area, the first area of the piezoelectric material poled in a first direction and the second area of the piezoelectric material poled in a second direction, wherein the poled first direction is in a Z-axis of the piezoelectric material and the poled second direction is in a Radial axis of the piezoelectric material;
   a first electrode positioned in the first area, on a first surface of the piezoelectric material; and
   a second electrode positioned in the second area, on the first surface, of the piezoelectric material, the first and second electrodes configured to receive or pass voltages; and
   a third electrode located on a second surface of the piezoelectric material, the third electrode configured to receive or pass voltages,
   wherein at least one of an (i) application of voltages to the first, second and third electrodes generates electric fields in the piezoelectric material which result in actuation of the piezoelectric material or (ii) application of pressure or strain to the diaphragm generates electric potentials at the first, second and third electrodes.

2. The structure according to claim 1, wherein the third electrode is formed as two separate electrode areas respectively corresponding to the first and second electrodes on the first side of the diaphragm.

3. The structure according to claim 2, wherein an electric field applied to the first area is in a direction parallel to the poled direction of the first area and an electric field applied to the second area is in a radial direction as the poled direction of the second area.

4. The structure according to claim 3, wherein actuation of the first area causes a length change in the Radial direction and actuation of the second area causes a length change in the Radial direction of an opposite sign of the first area.

5. The structure according to claim 1, wherein the first area is a disc of piezoelectric material, and the second area is an annular ring of piezoelectric material, concentric with and exterior to the disc.

6. The structure according to claim 1, further including a boundary between the first area and the second area, the boundary, wherein the boundary is located at natural bending modes of the diaphragm.

7. The structure according to claim 1, wherein the piezoelectric material covers substantially the entire surface of the diaphragm.

8. The structure according to claim 1, wherein the piezoelectric material extends past the surface of the diaphragm.

9. A method of actuating a piezoelectric diaphragm structure comprising:
   defining a piezoelectric material on a first surface of a diaphragm of the diaphragm structure as having a first area and a second area;
   poling the piezoelectric material of the first area in a Z-axis;
   poling the piezoelectric material of the second area in a Radial axis;
   supplying, selectively, a first electrode arrangement located in the first area of the piezoelectric material with voltage;
   supplying, selectively, a second electrode arrangement located in the first area of the piezoelectric material with voltage;
   supplying, selectively, a third electrode arrangement located on a second surface of the piezoelectric material, with voltage; and
   generating electric fields, in response to the supplied voltages, resulting in actuation of the piezoelectric material.

10. The method according to claim 9, wherein actuation of the first area causes a length change in the Radial direction, and actuation of the second area causes a length change in the Radial direction of an opposite sign of the first area.

11. The method according to claim 10, wherein the third electrode arrangement includes a third electrode located in a first area of a second surface of the piezoelectric material, and a fourth electrode located in a second area of the second surface of the piezoelectric material.

12. The method according to claim 9, further including covering substantially the entire surface of the diaphragm with piezoelectric material.

13. The method according to claim 9, further including extending the piezoelectric material past the surface of the diaphragm.

14. The method according to claim 1, wherein an electric field applied to the first area is in a direction parallel to the poled direction of the first area and an electric field applied to the second area is in a Radial direction as the poled direction of the second area.

15. A piezoelectric diaphragm structure comprising:
a diaphragm;
a piezoelectric material located on the diaphragm, defined as having a first area and a second area, the first area of the piezoelectric material poled in a first direction and the second area of the piezoelectric material poled in a second direction, wherein the poled first direction is in a Z-axis of the piezoelectric and the poled second direction is in the Radial axis of the piezoelectric; and
an electrode arrangement, including a first electrode positioned on a first surface of the first area of the piezoelectric, a second electrode positioned on a first surface of the second area of the piezoelectric, a third electrode positioned on a second surface of the first area of the piezoelectric and a fourth electrode positioned on a second surface of the second area of the piezoelectric, the electrode arrangement configured to at least one of receive voltages or pass voltages, wherein selective receipt of voltages by the first, second, third and fourth electrodes generates electric fields in the piezoelectric material, resulting in actuation of the piezoelectric material.

16. The structure according to claim 15, wherein the second electrode and fourth electrode are positioned in a staggered relationship to each other.

17. The structure according to claim 15, wherein the second electrode and the fourth electrode are positioned in an aligned relationship to each other.

18. The structure according to claim 16, wherein an electric field applied to the first area is in a direction parallel to the poled direction of the first area and an electric field applied to the second area is in a Radial direction as the poled direction of the second area.

19. The structure according to claim 18, wherein actuation of the first area causes a length change in the Radial direction and actuation of the second area causes a length change in the Radial direction of an opposite sign of the first area.

20. The structure according to claim 16, wherein the first area is a disc of piezoelectric material, and the second area is an annular ring of piezoelectric material concentric with and exterior to the disc.

21. The structure according to claim 16, further including a boundary between the first area and the second area, the boundary, wherein the boundary is located at natural bending modes of the diaphragm.

22. The structure according to claim 16, wherein the piezoelectric material covers substantially an entire surface of the diaphragm.

23. The structure according to claim 16, wherein the piezoelectric material extends past the surface of the diaphragm.

* * * * *